(12) United States Patent
Rozenblit et al.

(10) Patent No.: US 7,706,760 B2
(45) Date of Patent: *Apr. 27, 2010

(54) SYSTEM AND METHOD FOR SATURATION DETECTION, CORRECTION AND RECOVERY IN A POLAR TRANSMITTER

(75) Inventors: Dmitriy Rozenblit, Irvine, CA (US);
Tirdad Sowlati, Irvine, CA (US);
Darioush Agahi, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 1022 days.

This patent is subject to a terminal disclaimer.

(21) Appl. No.: 11/431,758

(22) Filed: May 10, 2006

(65) Prior Publication Data
US 2007/0264946 A1    Nov. 15, 2007

(51) Int. Cl.
*H01Q 11/12* (2006.01)
*H04B 1/04* (2006.01)

(52) U.S. Cl. .............. 455/127.1; 455/127.2; 455/127.3; 455/522; 455/69; 330/250; 330/251; 330/285

(58) Field of Classification Search .............. 455/522, 455/69, 39, 73, 91, 194.2, 345.1, 127.1, 127.2, 455/127.3; 330/250, 251, 285, 278
See application file for complete search history.

(56) References Cited

U.S. PATENT DOCUMENTS

| | | | |
|---|---|---|---|
| 5,689,815 A | | 11/1997 | Yamazaki et al. |
| 6,430,402 B1 | * | 8/2002 | Agahi-Kesheh .......... 455/115.3 |
| 2005/0064828 A1 | * | 3/2005 | Kurakami et al. ........ 455/115.1 |
| 2005/0186930 A1 | | 8/2005 | Rofougaran et al. |

* cited by examiner

*Primary Examiner*—Tuan A Pham

(57) ABSTRACT

A system for saturation detection, correction and recovery in a power amplifier includes a power amplifier, a closed power control loop configured to develop a power control signal ($V_{PC}$), and power control circuitry configured to reduce the power control signal if the power amplifier is operating in a saturation mode.

13 Claims, 6 Drawing Sheets

SYSTEM AND METHOD FOR SATURATION DETECTION, CORRECTION AND RECOVERY IN A POLAR TRANSMITTER

BACKGROUND

With the increasing availability of efficient, low cost electronic modules, portable communication devices are becoming more and more widespread. A portable communication device includes one or more power amplifiers for amplifying the power of the signal to be transmitted from the portable communication device.

With the decreasing size of portable communication devices, power efficiency is one of the most important design criteria. Reducing power consumption prolongs power source life and extends stand-by and talk time of the portable communication device. In a portable communication device that uses a non-constant amplitude output (i.e., one that modulates and amplifies both a phase component and an amplitude component), a linear power amplifier is typically used. The power control can be open loop or closed loop. In one example of a closed loop power control system, the amplitude signal is used to provide power control in the closed feedback loop.

In a system that uses closed loop amplitude power control, it is possible to saturate the amplitude power control loop, and thereby drive the power amplifier into a saturated condition. When operating in saturation mode, the power amplifier can no longer respond to an increase in the power control signal. This condition is worsened under extreme supply voltage conditions, such as low available battery voltage, and/or extreme temperature conditions, and when the power amplifier is presented with a mismatched load, caused by, for example, movement of the antenna, or if the antenna is presented to a reflective surface, such as a metallic surface.

When the power control loop is saturated, RF parameters, such as the RF output spectrum, become degraded. It is desirable to detect the onset of power amplifier saturation, and controllably bring the power amplifier out of saturation before the power control loop starts to ramp down.

SUMMARY

Embodiments of the invention include a system for saturation detection, correction and recovery including a power amplifier, a closed power control loop configured to develop a power control signal ($V_{PC}$), and power control circuitry configured to reduce the power control signal if the power amplifier is operating in a saturation mode.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
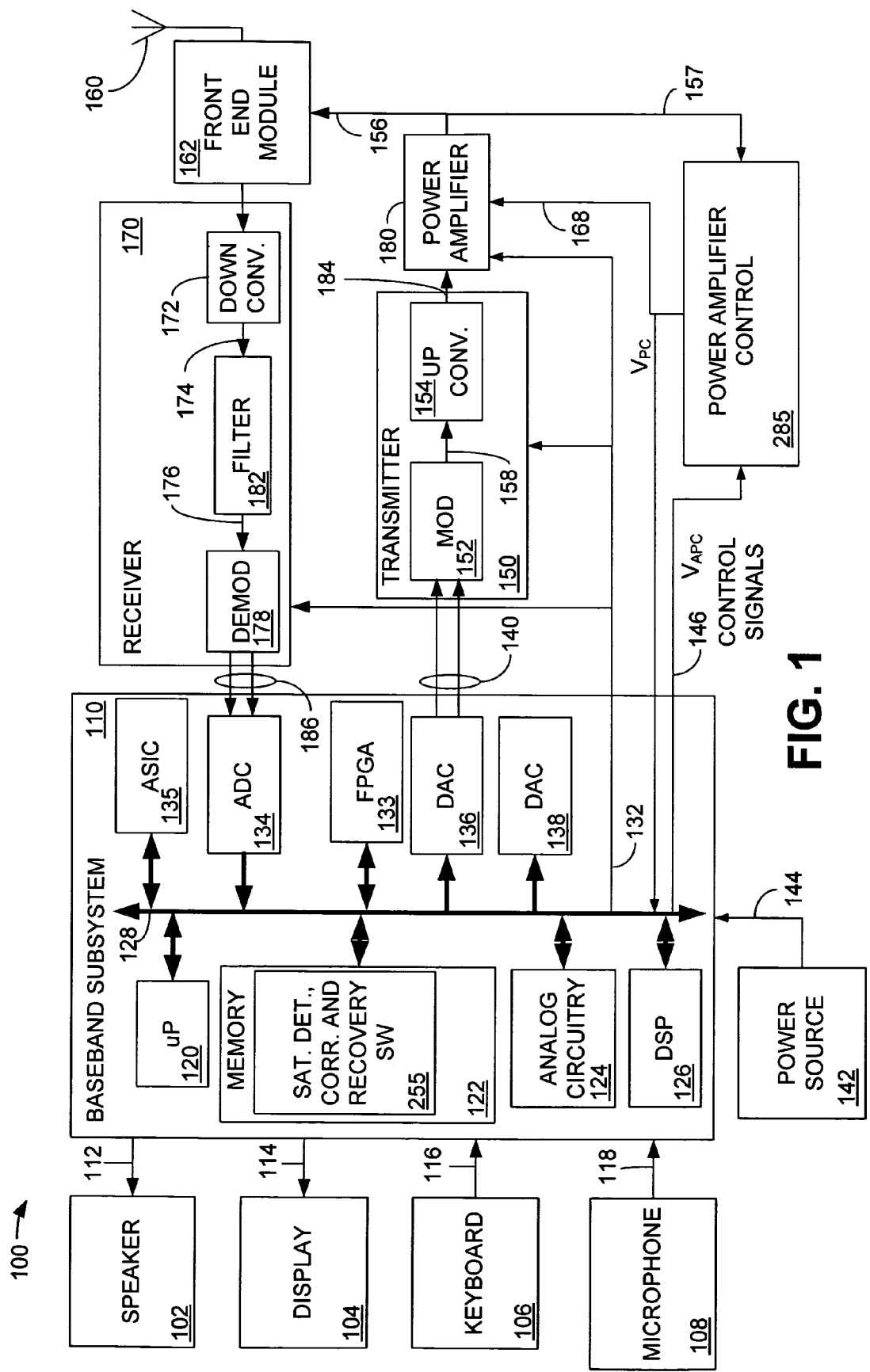
FIG. 1 is a block diagram illustrating a simplified portable transceiver including a power amplifier control element according to one embodiment of the invention.

Although described with particular reference to a portable transceiver, the system and method for saturation detection, correction and recovery can be implemented in any communication device employing a closed feedback power control loop. Furthermore, in some implementations, the system and method for saturation detection, correction and recovery can prevent the power amplifier from entering saturation or cause the power amplifier to gracefully exit saturation as soon as even minimal saturation is detected.

The system and method for saturation detection, correction and recovery can be implemented in hardware, software, or a combination of hardware and software. When implemented in hardware, the system and method for saturation detection, correction and recovery can be implemented using specialized hardware elements and logic. When the system and method for saturation detection, correction and recovery is implemented partially in software, the software portion can be used to control components in the power amplifier control element so that various operating aspects can be software-controlled. The software can be stored in a memory and executed by a suitable instruction execution system (microprocessor). The hardware implementation of the system and method for saturation detection, correction and recovery can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for saturation detection, correction and recovery comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including an embodiment of a system and method for saturation detection, correction and recovery. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the system and method for soft saturation detection and correction is implemented, the baseband subsystem 110 may also include one or more of an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150, receiver 170 power amplifier 180 and the power amplifier control element 285 such as through connection 132 for example.

The baseband subsystem 110 generates a power control signal, referred to as $V_{APC}$ which is supplied to the power amplifier control element 285 via connection 146. The power control signal $V_{APC}$ is generated by the baseband subsystem 110 and is converted to an analog control signal by the digital-to-analog converter (DAC) 138, which will be described below. The power control signal $V_{APC}$ is illustrated as being supplied from the bus 128 to indicate that the signal may be generated in different ways as known to those skilled in the art. The power control signal $V_{APC}$ is a reference voltage signal that defines the transmit power level and provides the power profile. Generally, the power control signal, $V_{APC}$, controls the power amplifier as a function of the peak voltage of the power amplifier determined during calibration, and corresponds to power amplifier output power.

The control signals on connections 132 and 146 may originate from the DSP 126, the ASIC 135, the FPGA 133, or from microprocessor 120, and are supplied to a variety of connections within the transmitter 150, receiver 170, power amplifier 180, and the power amplifier control element 285. It should be noted that, for simplicity, only the basic components of the portable transceiver 100 are illustrated herein. The control signals provided by the baseband subsystem 110 control the various components within the portable transceiver 100. Further, the function of the transmitter 150 and the receiver 170 may be integrated into a transceiver.

As will be discussed below, the power amplifier control element 285 generates a power amplifier (PA) power control voltage, referred to as $V_{PC}$. The PA power control voltage, $V_{PC}$, controls the power output of the power amplifier 180 based on an amplitude reference signal. The PA power control voltage, $V_{PC}$, is generated in a closed power control loop that is formed by the components in the power amplifier control element 285, which will be described below. In an embodiment in accordance with the invention, the PA power control voltage, $V_{PC}$, is also supplied to the baseband subsystem 110. In accordance with an embodiment, the baseband subsystem 110 contains components (not shown in FIG. 1) that compare the magnitude of the $V_{PC}$ signal against a reference signal, $V_{REF}$. The reference signal, $V_{REF}$, establishes a threshold. As will be described below, when the PA power control voltage, $V_{PC}$, exceeds the level of the reference signal, $V_{REF}$, the power amplifier is said to be in saturation. After saturation of the power amplifier 180 is detected, the baseband subsystem 110 reacts by controllably adjusting the level of the power control signal, $V_{APC}$, by reducing the gain control voltage supplied to amplifiers in the power control element 285. In this manner, the power amplifier is controllably backed out of saturation.

If portions of the system and method for saturation detection, correction and recovery are implemented in software that is executed by the microprocessor 120, the memory 122 will also include saturation detection, correction and recovery software 255. The saturation detection, correction and recovery software 255 comprises one or more executable code segments that can be stored in the memory and executed in the microprocessor 120. Alternatively, the functionality of the saturation detection, correction and recovery software 255 can be coded into the ASIC 135 or can be executed by the FPGA 133, or another device. Because the memory 122 can be rewritable and because the FPGA 133 is reprogrammable, updates to the saturation detection, correction and recovery software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. In this example, the DAC 136 generates the in-phase (I) and quadrature-phase (Q) signals 140 that are applied to the modulator 152. The DAC 138 generates the ramp up/power control signal, $V_{APC}$, on connection 146. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information on connection 140 and provides a modulated signal via connection 158 to upconverter 154. The upconverter 154 transforms the modulated signal on connection 158 to an appropriate transmit frequency and provides the upconverted signal to a power amplifier 180 via connection 184. The power amplifier 180 amplifies the signal to an appropriate power level for the system in which the portable transceiver 100 is designed to operate.

Details of the modulator 152 and the upconverter 154 have been omitted, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed. For example, when the power amplifier module is used in a constant-amplitude, phase (or frequency) modulation application such as the global system for mobile communications (GSM), the phase modulated information is provided by the modulator 152. When the power amplifier module is used in an application requiring both phase and amplitude modulation such as, for example, extended data rates for GSM evolution, referred to as EDGE, the Cartesian in-phase (I) and quadrature (Q) components of the transmit signal are converted to their polar counterparts, amplitude and phase. The phase modulation is performed by the modulator 152, while the amplitude modulation is performed by the power amplifier control element 285, where the amplitude envelope is defined by the PA power control voltage $V_{PC}$, which is generated by the power amplifier control element 285.

The instantaneous power level of the power amplifier module 180 tracks $V_{PC}$, thus generating a transmit signal with both phase and amplitude components. This technique, known as polar modulation, eliminates the need for linear amplification by the power amplifier module, allowing the use of a more efficient saturated mode of operation while providing both phase and amplitude modulation.

The power amplifier 180 supplies the amplified signal via connection 156 to a front end module 162. The front end module comprises an antenna system interface that may include, for example, a diplexer having a filter pair that allows simultaneous passage of both transmit signals and receive signals, as known to those having ordinary skill in the art. The transmit signal is supplied from the front end module 162 to the antenna 160.

Using the PA power control voltage, $V_{PC}$, generated by the power amplifier control element 285, the power amplifier control element 285 determines the appropriate power level at which the power amplifier 180 operates to amplify the transmit signal. The PA power control voltage, $V_{PC}$, is also used to provide envelope, or amplitude, modulation when required by the modulation standard. The power amplifier control element 285 will be described in greater detail below.

A signal received by antenna 160 will be directed from the front end module 162 to the receiver 170. The receiver 170 includes a downconverter 172, a filter 182, and a demodulator 178. If implemented using a direct conversion receiver (DCR), the downconverter 172 converts the received signal from an RF level to a baseband level (DC), or a near-baseband level (~100 kHz). Alternatively, the received RF signal may be downconverted to an intermediate frequency (IF) signal, depending on the application. The downconverted signal is sent to the filter 182 via connection 174. The filter comprises a least one filter stage to filter the received downconverted signal as known in the art.

The filtered signal is sent from the filter 182 via connection 176 to the demodulator 178. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
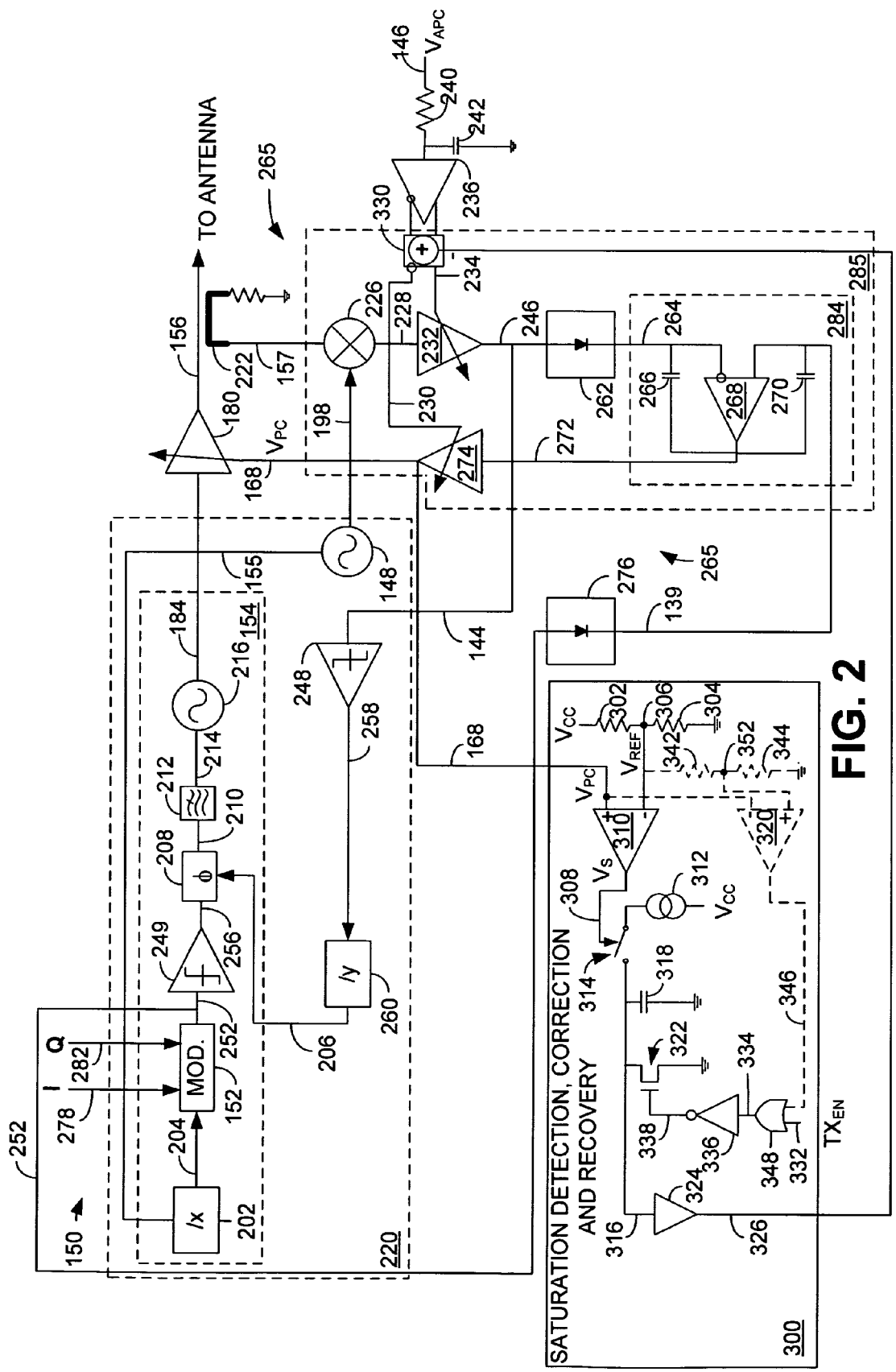
FIG. 2 is a block diagram illustrating the upconverter, power amplifier control element and a saturation detection, correction and recovery element in accordance with an embodiment of the invention.

FIG. 2 is a block diagram illustrating the upconverter 154, power amplifier control element 285 and a saturation detection and power control element 300 in accordance with an embodiment of the invention. Beginning with a description of the power amplifier control element 285, which forms a closed power control loop 265, also referred to as an "AM control loop," a portion of the output power present at the output of power amplifier 180 on connection 156 is diverted by coupler 222 via connection 157 and input to a mixer 226. The mixer 226 also receives a local oscillator (LO) signal from a synthesizer 148 via connection 198.

The mixer 226 downconverts the RF signal on connection 157 to an intermediate frequency (IF) signal on connection 228. For example, the mixer 226 takes a signal having a frequency of approximately 2 gigahertz (GHz) on connection 157 and downconverts it to a frequency of approximately 100 megahertz (MHz) on connection 228 for input to variable gain element 232. The variable gain element 232 can be, for example but not limited to, a variable gain amplifier or an attenuator. In such an arrangement, the variable gain element 232 might have a dynamic range of approximately 70 decibels (dB) i.e., +35 dB/−35 dB. The variable gain element 232 receives a control signal input from the non-inverting output of an adder 330 via connection 234. The adder receives the power control signal, $V_{APC}$, from an amplifier 236. The input to amplifier 236 is the power control signal, $V_{APC}$, which is supplied via connection 146 from the baseband subsystem 110 of FIG. 1. The $V_{APC}$ signal on connection 146 is a reference voltage signal that defines the transmit power level and provides the power profile. The signal on connection 146 is supplied to a reconstruction filter, which includes resistor 240 and capacitor 242. In this manner, a reference voltage for the transmit power level and power profile is supplied via connection 234 to the control input of the variable gain element 232.

The output of the variable gain element 232 on connection 246 is an IF signal and includes modulation having both an AM component and a PM component and is called a "power measurement signal." This power measurement signal is related to the absolute output power of power amplifier 180, and includes a very small error related to the AM and PM components present in the signal. The output of the variable gain element 232 on connection 246 is supplied to the input of power detector 262 and is also supplied to a limiter 248. The IF signal on connection 246 includes both an AM component and a PM component. The signal on connection 246 is supplied to a power detector 262, which provides, on connection 264, a baseband signal representing the instantaneous level of intermediate frequency (IF) power present on connection 246. The output of the power detector 262 on connection 264 is supplied to the inverting input of amplifier 268.

The amplifier 268, the capacitor 266 and the capacitor 270 form a comparator 284, which provides the error signal used to control the power amplifier 180 via connection 272. The non-inverting input to the amplifier 268 is supplied via connection 139 from the output of the modulator 152 through the power detector 276. The signal on connection 139 is supplied to the non-inverting input of the amplifier 268 and contains the AM modulation developed by the modulator 152 for input to the control port 168 of the power amplifier 180.

The gain of the power amplifier control element 285 amplifies the signal on connection 272 such that the difference between the signals on connection 264 and on connection 139 input to amplifier 268 provide an error signal on connection 272 that is used to control the output of the power amplifier 180. The error signal on connection 272 is supplied to variable gain element 274, which can be similar in structure to the variable gain element 232. However, the variable gain element 274 has a function that is inverse to the function of the variable gain element 232. The control input to variable gain element 274 is supplied from the inverting output of the adder 330 via connection 230. In this manner, the PA power control voltage, $V_{PC}$, supplied to the control port 168 of the power amplifier 180 drives the power amplifier 180 to provide the proper output on connection 156.

The level of the signal on connection 264 and the level of the signal on connection 139 should be equal. For example, if the output level of the variable gain element 232 is increased by a factor of 10, then the level of the output of power amplifier 180 should be decreased accordingly, to maintain equilibrium at the input of the amplifier 268. The output of the power amplifier 180 changes to cancel the gain change of variable gain element 232. In this manner, the amplitude of the signal on connection 264 remains equal to the amplitude of the signal on connection 139. However, this implies that the signal on connection 228 lags the signal on connection 234 with the result that the two signals will not completely cancel. In this manner, an error signal with an AM portion and a PM portion is present on connection 246. The signal on connection 246 is converted by power detector 262 from an IF signal to a baseband signal on connection 264. The signal on connection 264 is amplified by variable gain element 268 and variable gain element 274 and provided as input to the power amplifier control port on connection 168. The power amplifier control element 285 has sufficient gain so that the error signal on connection 264 can be kept small. In such a case, the gain changes of variable gain element 232 and the power amplifier 180 will substantially be the inverse of each other.

In addition to amplifying the error signal on connection 264, the variable gain element 268 also compares the power measurement signal on connection 264 with a reference voltage signal including an AM portion on connection 139, supplied by the modulator 152. The DC voltage level on connection 139 affects the desired static output power for the power amplifier 268, irrespective of AM modulation. The amplifier 268 compares the signal level on connection 264 with the signal level on connection 139 and then amplifies the difference, thus providing a power control signal on connection 272. The comparator 284 functions as an integrator, which is also a low pass filter. Alternatively, the AM portion of the signal may be introduced to the power amplifier control element 285 in other ways, such as, for example, through the variable gain element 232.

The power control signal on connection 272 drives the variable gain element 274, which corrects for the effect that the variable gain element 232 has on the transfer function of the power amplifier control element 285. The variable gains of the variable gain element 232 and variable gain element 274 are complimentary. Because the power measurement signal is present on connection 264 and the AM error signal is present on connection 139, the amplifier 268 provides a dual function; (1) it amplifies the AM error signal on connection 139 so as to modulate the power output of power amplifier 180 via connection 250 to have the correct amount of AM; and (2) it performs the average power comparison and amplifies the result, thus providing a control signal on connection 272 that drives the variable gain element 274. The variable gain element 274 provides the PA power control voltage, $V_{PC}$, on connection 168, which includes the AM portion and which controls the output of the power amplifier 180. In this manner, power output is controlled and the desired AM portion of the signal is supplied to the control input 168 ($V_{PC}$) of power amplifier 180 and made present on the power amplifier output on connection 156. The mixer 226, variable gain element 232, power detector 262, amplifier 268 and the variable gain element 274 provide a continuous closed power control loop 265 to control the power output of power amplifier 180, while allowing for the introduction of the AM portion of the transmit signal via connection 139.

In accordance with an embodiment of the invention, the PA power control voltage, $V_{PC}$, is also supplied to a saturation detection, correction and recovery element 300, which can be located in the RF section. In accordance with an embodiment, the PA power control voltage, $V_{PC}$, is supplied via connection 168 to the non-inverting input of a comparator 310. The comparator 310 can be, for example, a differential comparator. A reference voltage signal, $V_{REF}$, is formed at the node 306 by resistors 302 and 304 using the input voltage signal, $V_{CC}$, as input. The value of $V_{CC}$ depends on the system voltage level and the value of the resistors 302 and 304 is chosen based on system operating parameters. The reference voltage, $V_{REF}$, can be created from a band gap voltage that is supply-independent, as known in the art. The reference voltage signal, $V_{REF}$, is supplied via connection 306 to the inverting input of the comparator 310. The reference voltage signal, $V_{REF}$, is used as a threshold against which to measure the level of the PA power control voltage, $V_{PC}$.

When the power amplifier 180 approaches saturation, its power control gain decreases. This means that to achieve the same proportion in output power per change in the level of the PA power control voltage, $V_{PC}$, the $V_{PC}$ signal must increase much more compared to when the power amplifier was not in saturation. When the power amplifier is close to saturation, the closed power control loop 265 increases the level of the $V_{PC}$ signal in order to increase the power amplifier output power. If the power amplifier does not reach the required power level, then the closed power control loop 265 increases $V_{PC}$ as high as possible. Therefore, when the $V_{PC}$ signal is at its maximum based on supply voltage, it is an indication that the power amplifier is approaching saturation. The reference voltage, $V_{REF}$, on connection 305 is selected to be higher than the maximum voltage of $V_{PC}$, which would give the highest power level from the power amplifier without the power amplifier entering saturation.

The comparator 310 continuously compares the level of the PA power control voltage, $V_{PC}$, against the reference voltage signal, $V_{REF}$. When the level of the PA power control voltage, $V_{PC}$, exceeds the level of the reference voltage signal, $V_{REF}$, the output of the comparator 310 goes to a logic high state, which closes a switch 314 and causes a current source 312 to turn on. The current source 312 begins to charge a capacitor 318. As long as the output of the comparator 310 remains logic high, the current source 312 charges the capacitor 318.

A transistor 322 is coupled in parallel with the capacitor 318. The transistor 322 is controlled by a transmit enable ($TX_{EN}$) signal supplied from the baseband subsystem 110 via connection 332. The $TX_{EN}$ signal is supplied to an optional OR gate 348, which will be described below, and then to an amplifier 336. The output of the amplifier 336 on connection 338 is coupled to the gate of the transistor 322. While illustrated as a field effect transistor, the transistor 322 may be implemented using other technologies.

The signal on connection 316 is supplied to a scaling buffer 324 and then to the adder 330 via connection 326. The signal on connection 326 is subtracted from the output of the amplifier 236, thus reducing the level of the control signal supplied to the variable gain element 232 and the variable gain element 274. This reduction in control voltage dynamically forces the power control element 285 to lower the target output power of the power amplifier (or suspend any increase in power), thus preventing the power amplifier 180 from going deeper into saturation, and eventually exiting saturation. When the output of the comparator 310 goes to logic low, indicating that the level of the reference voltage signal $V_{REF}$, is higher than the PA power control voltage, $V_{PC}$, the switch 314 opens, thus suspending the charging of the capacitor 318. The capacitor 318 maintains its charge, and the power control loop 265 therefore preserves its power of operation just below saturation, until the $TX_{EN}$ signal goes to logic low. The transition of the $TX_{EN}$ signal to logic low signals the end of the transmit burst. At this time the capacitor 318 is discharged and awaits the next transmit burst.

In an alternative and optional application, the saturation detection, correction and recovery element 300 includes another comparator 320. The comparator 320 can be similar to the comparator 310. The PA power control signal, $V_{PC}$, is supplied to the inverting input of the comparator 320. A second reference voltage signal, $V_{REF2}$, is developed using the resistors 342 and 344 at node 352. The second reference voltage signal, $V_{REF2}$, is smaller in magnitude than the first reference voltage signal $V_{REF}$, and is supplied to the non-inverting input of the comparator 320. When the output of the comparator 320 goes to logic high, indicating that the level of the reference voltage signal $V_{REF2}$ is higher than the PA power control voltage, $V_{PC}$, the logic high output of the comparator 320 on connection 346 is sent to the OR-gate along with the $TX_{EN}$ signal on connection 332, thus causing the output of the OR gate 348 to transition to logic high and thus discharge the capacitor 318. Either the $TX_{EN}$ signal or the drop of $V_{PC}$ below $V_{REF2}$ can reset the capacitance.

In this manner, the power amplifier 180 can be controllably prevented from going into saturation or if in saturation, backed out of saturation softly without violating switching transient requirements in the GSM communication standard.

The circuitry in the saturation detection, correction and recovery element 300 other than the comparator 310 (and the comparator 320 if implemented) may be activated only when saturation is detected. In this manner, the impact of this circuitry on the transmitter output power is limited to a few dB and will not degrade system performance. The saturation detection, correction and recovery element 300 contributes to improving the robustness of the transmitter 150 with respect to supply voltage variation and voltage standing wave ratio (VSWR) due to load variations.

At all times, the closed power control loop 265 allows the correction of any phase shift caused by power amplifier 180. The phase locked loop 220 includes a closed power control feedback loop for looping back the output of power amplifier 180 to the input of phase/frequency detector 208. Any unwanted phase shift generated by the power amplifier 180 will be corrected by the phase locked loop 220. The output of variable gain element 232 passes any phase distortion present via connection 246 to limiter 248 for correction by the phase locked loop 220. As such, the phase of the output of power amplifier 180 is forced to follow the phase of the LO signal on connection 155.

To remove the AM from the output of variable gain element 232, the variable gain element 232 is connected via connection 246 and connection 144 to the input of limiter 248. The limiter 248 develops a local oscillator signal containing only a PM component on connection 258. This LO signal is supplied via connection 258 to a divider 260, which divides the signal on connection 258 by a number, "y." The number "y" is chosen so as to minimize the design complexity of the synthesizer 148. The output of the divider 260 is supplied to the phase/frequency detector 208.

An unmodulated input signal from synthesizer 148 is supplied to the divider 202 via connection 155. The unmodulated input signal is frequency divided by a number "x" to provide a signal having an appropriate frequency on connection 204. The number "x" is chosen to minimize the design complexity of the synthesizer 148 and can be, for example, but not limited to, chosen to convert the output of the synthesizer 148 to a frequency of 100 MHz. The output of the divider on connection 204 is supplied to the modulator 152. In addition, the baseband I and Q information signals are supplied via connections 278 and 282, respectively, to the modulator 152. The I and Q baseband information signal interface is understood by those having ordinary skill in the art. As a result of the operation of the modulator 152, the output on connection 252 is an intermediate frequency signal including an AM component in the form of an AM reference signal and a small PM error signal. The output of modulator 152 is supplied via connection 252 to power detector 276. The output of power detector 276 also includes the AM portion of the desired transmit signal. The signal provided on connection 139 is a reference signal for input to the power amplifier control element 285. Because the power amplifier control element 285 has limited bandwidth, the rate at which the amplitude modulation occurs on connection 139 is preferably within the bandwidth of the power control feedback loop 265.

The components within the phase locked loop 220 provide gain for the comparison of the PM on connection 258 and the modulator connections 278 and 282, thus providing a phase error output of the modulator 152 on connection 252. This phase error signal is then supplied to limiter 248, which outputs a signal on connection 258 containing the small PM phase error component.

The error signal output of modulator 152 on connection 252 containing the phase error, will get smaller and smaller as the gain of the phase locked loop 220 increases. However, there will always be some error signal present, thus enabling the phase locked loop 220 to achieve phase lock. It should be noted that even when the power amplifier 180 is not operating, there will always be some small leakage through the power amplifier 180 onto connection 156. This small leakage is sufficient to provide a feedback signal through the variable gain element 232 and into the phase locked loop 220 such that the phase locked loop 220 can be locked using just the leakage output of power amplifier 180. In this manner, a single feedback loop can be used to continuously control the output power of power amplifier 180 from the time that the amplifier is off through the time when the amplifier 180 is providing full output power.

The output of the modulator 152 is supplied via connection 252 to a limiter 249. The limiter 249 cancels the AM component present on connection 252, thereby preventing any AM-to-PM conversion in the phase/frequency detector 208. The phase/frequency detector 208 receives an unmodulated input signal from the limiter 249. The phase/frequency detector 208 also receives the output of divider 260 via connection 206. The phase/frequency detector 208 detects any phase difference between the signal on connection 256 and the signal on connection 206 and places a signal on connection 210 that has an amplitude proportional to the difference. When the phase difference reaches 360°, the output of phase/frequency detector 208 on connection 210 will become proportional to the frequency difference between the signals on connections 256 and 206.

The output of phase/frequency detector 208 on connection 210 is a digital signal having a value of either a 0 or a 1 with a very small transition time between the two output states. This signal on connection 210 is supplied to low-pass filter 212, which integrates the signal on connection 210 and places a DC signal on connection 214 that controls the frequency of the transmit voltage control oscillator (TX VCO) 216. The output of TX VCO 216 is supplied via connection 184 directly to the power amplifier 180. In this manner, the synthesizer 148, limiter 248, modulator 152, limiter 256, divider 260, divider 202, phase/frequency detector 208, low-pass filter 212 and TX VCO 216 form a phase locked loop (PLL) 220, which is used to determine the transmit frequency on connection 184. Alternatively, the modulator 152 may reside outside of the PLL 220.

When the PLL 220 is settled, or "locked," then the two signals entering the phase/frequency detector 208 on connections 256 and 206 have substantially the same phase and frequency, and the output of the phase/frequency detector 208 on connection 210 goes to zero. The output of the integrating low-pass filter 212 on connection 214 stabilizes, resulting in a fixed frequency out of TX VCO 216. For example, the synthesizer 148 and the mixer 226 ensure that the frequency of the signal output from the TX VCO 216 on connection 184 tracks the sum of the frequencies of the local oscillator signal supplied by synthesizer 148 and the IF frequency on connection 206.

When the phase locked loop 220 is locked, the phase of the signal on connection 256 and the phase of the signal on connection 206 will be substantially equal. Because the amount of PM on connection 206 should be very small, the gain in the phase locked loop 220 has to be sufficiently high to amplify the error signal on connection 206 to a level at which the phase/frequency detector 208 can make a comparison. By using the modulator 152 to impose the I and Q information signals on the signal on connection 204 in a direction opposite from which it is desirable for the phase of the TX VCO to move, and because it is desirable for the phase locked loop 220 to remain locked, the phase of the signal output from the TX VCO 216 on connection 184 will move opposite that of the phase imposed by the modulator 152. In this manner, the PM error signal present on connection 206 is minimized by the very high sensitivity, of the order of many MHz per volt, of the TX VCO 216.

Because the power amplifier control element 285 is a closed loop for AM signals at connection 139, it is possible to use a non-linear, and therefore highly efficient, power amplifier 180. Furthermore, the undesirable and detrimental AM-to-PM conversion, which occurs due to the amplitude dependence of an amplifier's phase shift, is rectified by the power amplifier 180 being included within the phase locked loop 220. By separating the AM and the PM modulation and by providing closed loop control for both the AM and PM modulation, a non-linear, and therefore highly efficient power amplifier can be used. The power amplifier control element 285 provides the AM portion of the signal and controls the output of the power amplifier 180 in such a way as to minimize low power inefficiency.

Figure 3:
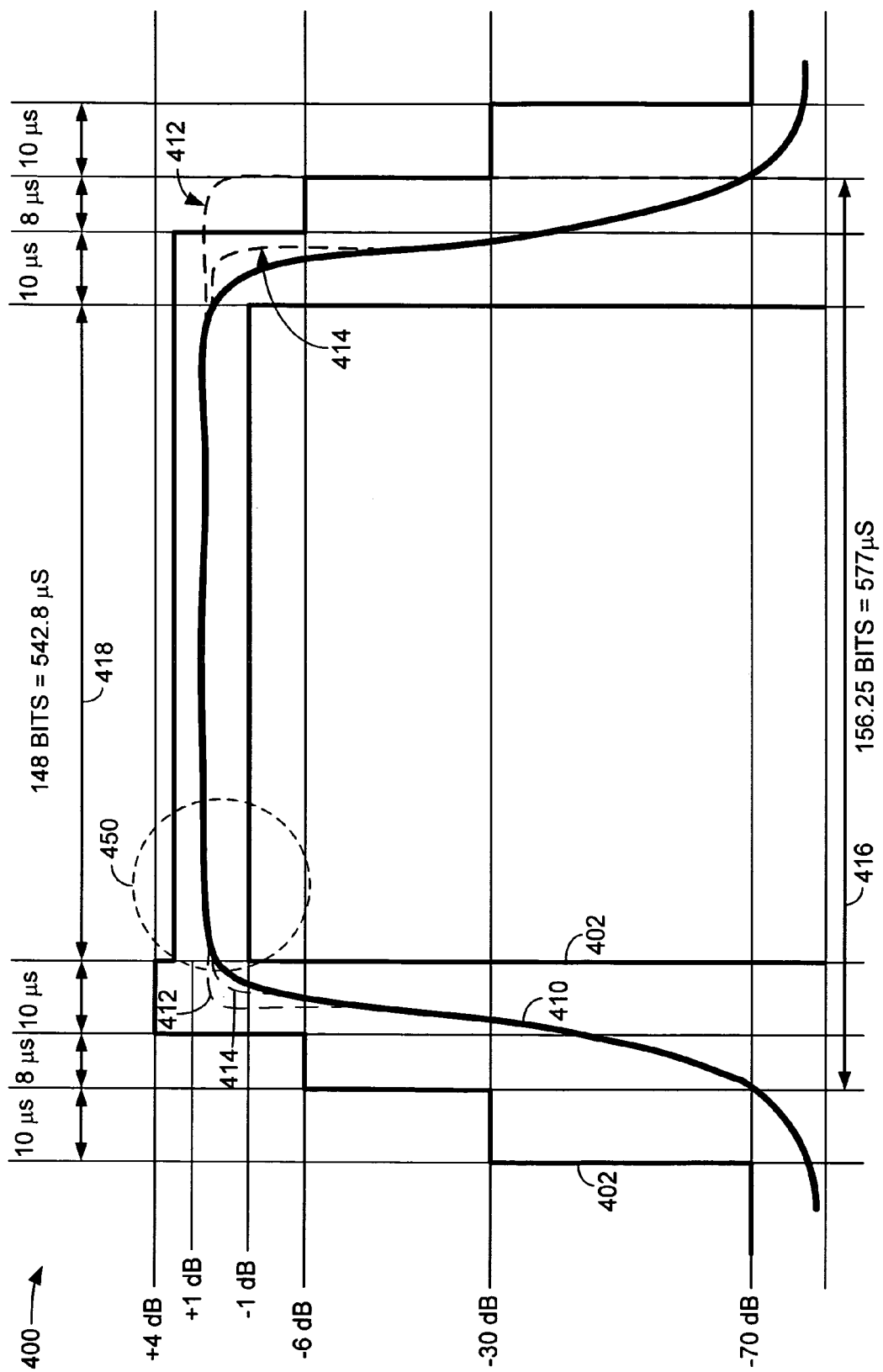
FIG. 3 is a graphical representation of the power output of the power amplifier during a typical output burst.

FIG. 3 is a graphical representation of the power output of the power amplifier during a typical output burst 400. The curve 410 illustrates the desired power output of the power amplifier 180. A power versus time mask 402 defines the power and time parameters within which the curve 410 must remain to comply with regulatory requirements. As shown in FIG. 3, the curve 410 indicates that output power remains below −70 dB until the beginning of the burst 400. In this example, the burst time is 156.25 bits, which corresponds to 577 μs and is indicated using reference numeral 416. The portion of the burst in which data is transmitted is 148 bits in duration, which corresponds to 542.8 μs, and is indicated using reference numeral 418. The ramp up of the curve 410 occurs in the 18 μs preceding the beginning of the period 418 and the ramp down of the curve 410 occurs in the 18 μs after the period 418. The curve 412, indicated with a doted line, indicates a deeply saturated power amplifier and the curve 414, also indicated with a dotted line, indicates a minimally saturated power amplifier. The curves 412 and 414 illustrate two exemplary saturation conditions of the power amplifier 180 (FIG. 2). In accordance with an embodiment of the invention, the saturation condition is detected and compensated, as described above.

Figure 4:
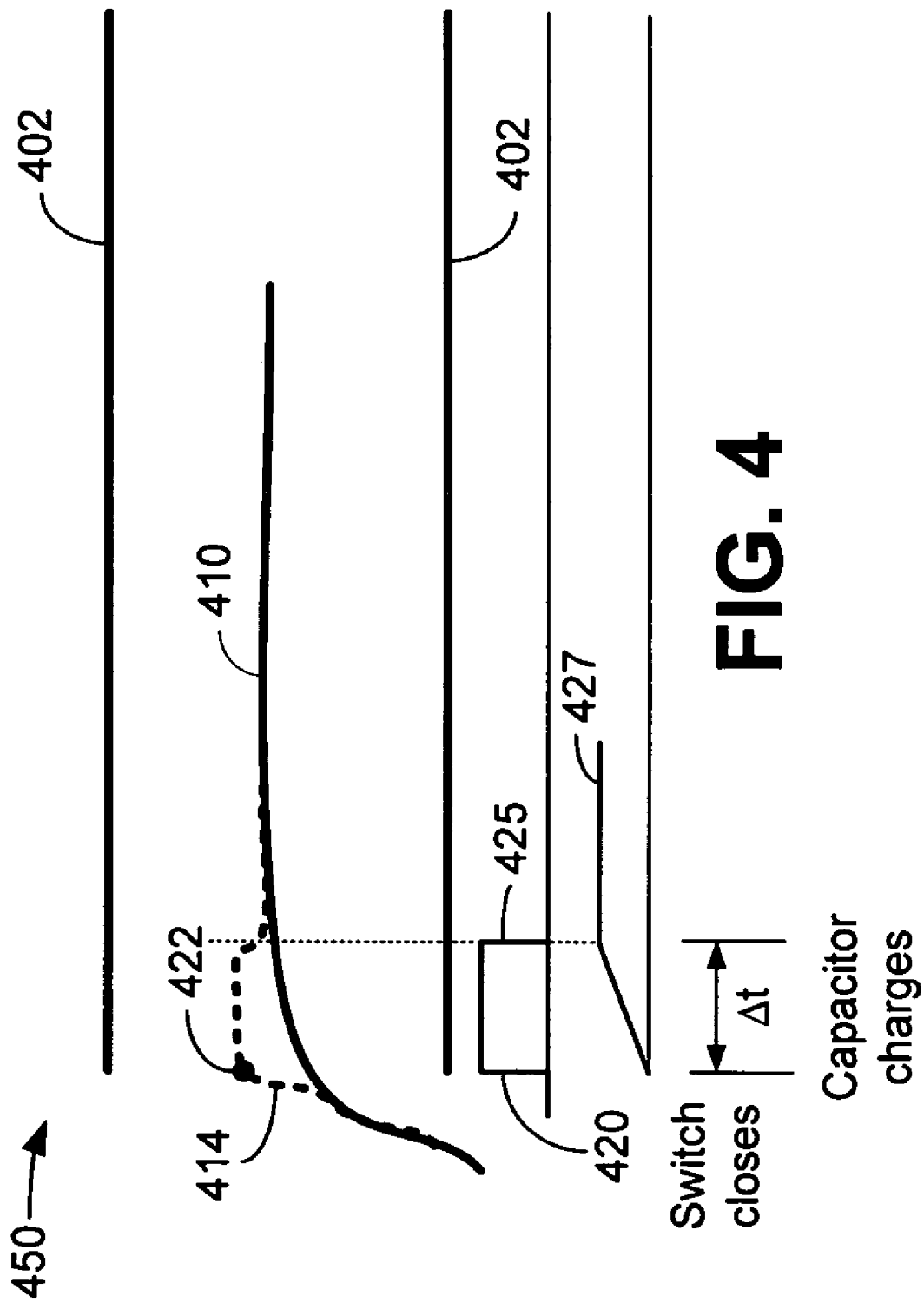
FIG. 4 is a graphical representation of a portion of the output burst of FIG. 3, illustrating the operation of the system and method for saturation detection, correction and recovery.

FIG. 4 is a graphical representation of a portion 450 of the output burst of FIG. 3, illustrating the operation of the system and method for saturation detection, correction and recovery. The power versus time mask 402 is shown for reference. The curve 414 represents the output of a minimally saturated power amplifier. The point 422 is the point at which saturation of the power amplifier 180 is detected, as described above. In accordance with an embodiment of the invention, at the point 422 when saturation is detected, the output of the comparator 310 (FIG. 2) transitions to logic high. In an embodiment, this is accomplished by comparing the PA power control voltage, $V_{PC}$, to the reference voltage signal, $V_{REF}$. When the level of the power control voltage, $V_{PC}$, exceeds the level of the reference voltage signal, $V_{REF}$, the comparator 310 sends an indicator signal on connection 308 closing the switch 314 (FIG. 2), which initiates the charging of the capacitor 318 (FIG. 2). The closing of the switch 314 (FIG. 2) is indicated at 420 in FIG. 4.

As the capacitor charges during the time period Δt, the signal on connection 316 (FIG. 2) is supplied to a scaling buffer 324 (FIG. 2) and then to the adder 330 (FIG. 2) via connection 326. The signal on connection 326 is subtracted from the output of the amplifier 236, thus reducing the level of the control signal supplied to the variable gain element 232 and the variable gain element 274 (FIG. 2). This reduction in control voltage dynamically forces the power control element 285 to lower the target output power of the power amplifier (or suspend any increase in power), thus preventing the power amplifier 180 from going into saturation, or, if already in saturation, causing the power amplifier to exit saturation, as indicated at point 425. When the output of the comparator 310 goes to logic low, indicating that the level of the reference voltage signal $V_{REF}$, is higher than the PA power control voltage, $V_{PC}$, the switch 314 opens, thus suspending the charging of the capacitor 318. The capacitor 318 retains its charge, as indicated at 427, and the power control loop 265 therefore preserves its power of operation just below saturation, until the $TX_{EN}$ signal goes to logic low. The level of the PA power control voltage, $V_{PC}$, is continuously compared against the reference voltage signal, $V_{REF}$, by the comparator 310 (FIG. 2).

Figure 5:
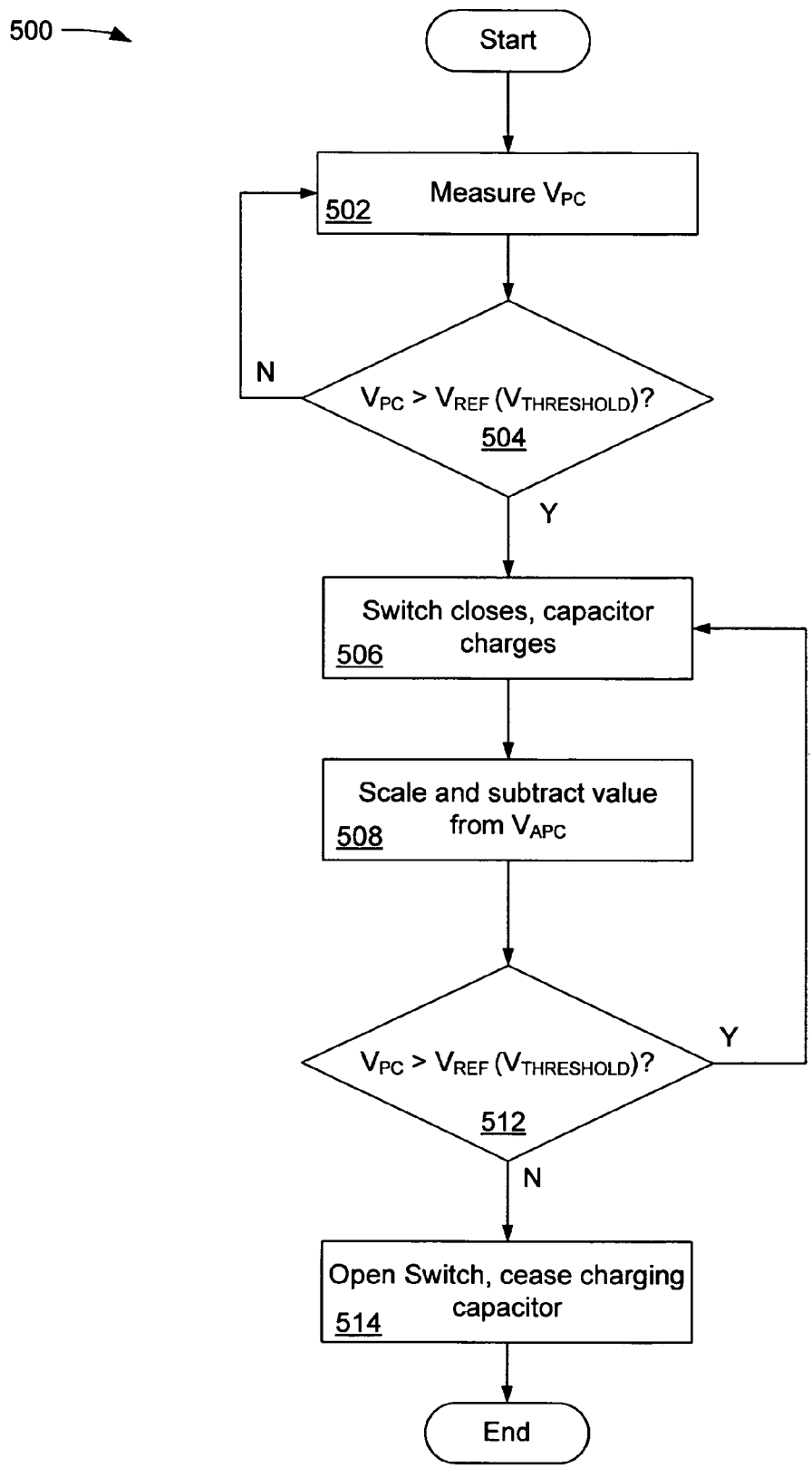
FIG. 5 is a flow chart illustrating the operation of an embodiment of the system and method for saturation detection, correction and recovery.

FIG. 5 is a flow chart illustrating the operation of an embodiment of the system and method for saturation detection, correction and recovery. The blocks in the flowchart can be performed in the order shown, out of the order shown, or can be performed in parallel. In block 502, the level of the PA power control voltage, $V_{PC}$, is measured. In block 504, the level of the PA power control voltage, $V_{PC}$, is compared against the level of the reference voltage level, $V_{REF}$. If the level of the PA power control voltage, $V_{PC}$, is equal to or lower than the level of the reference voltage level, $V_{REF}$, the process returns to block 502. If the level of the PA power control voltage, $V_{PC}$, exceeds the level of the reference voltage level, $V_{REF}$, then, in block 506, the output of the comparator 310 (FIG. 2) goes to a logic high state, which closes the switch 314 and causes the current source 312 to turn on. The current source 312 begins to charge a capacitor 318. As long as the output of the comparator 310 remains logic high, the current source 312 charges the capacitor 318.

In block 508, the signal on connection 316 is supplied to a scaling buffer 324 and then to the adder 330 via connection 326. The signal on connection 326 is subtracted from the output of the amplifier 236, thus reducing the level of the control signal supplied to the variable gain element 232 and the variable gain element 274. As a result of the reduction in control voltage, the power control element 285 lowers the target output power of the power amplifier (or suspend any increase in power), thus causing the power amplifier to exit saturation.

In block 512, the level of the PA power control voltage, $V_{PC}$, is compared against the level of the reference voltage level, $V_{REF}$. If the level of the PA power control voltage, $V_{PC}$, is greater than the reference voltage level, $V_{REF}$, then the process returns to block 506 and the capacitor continues charging. If the level of the PA power control voltage, $V_{PC}$, is equal to or lower than the level of the reference voltage level, $V_{REF}$, then, in block 514, the output of the comparator 310 (FIG. 2) goes to a logic low state, which opens the switch 314 and causes the current source 312 to turn off and causes the capacitor 318 to stop charging. The capacitor 318 maintains its charge, and the power control loop 265 therefore preserves its power of operation just below saturation, until the $TX_{EN}$ signal goes to logic low.

Figure 6:
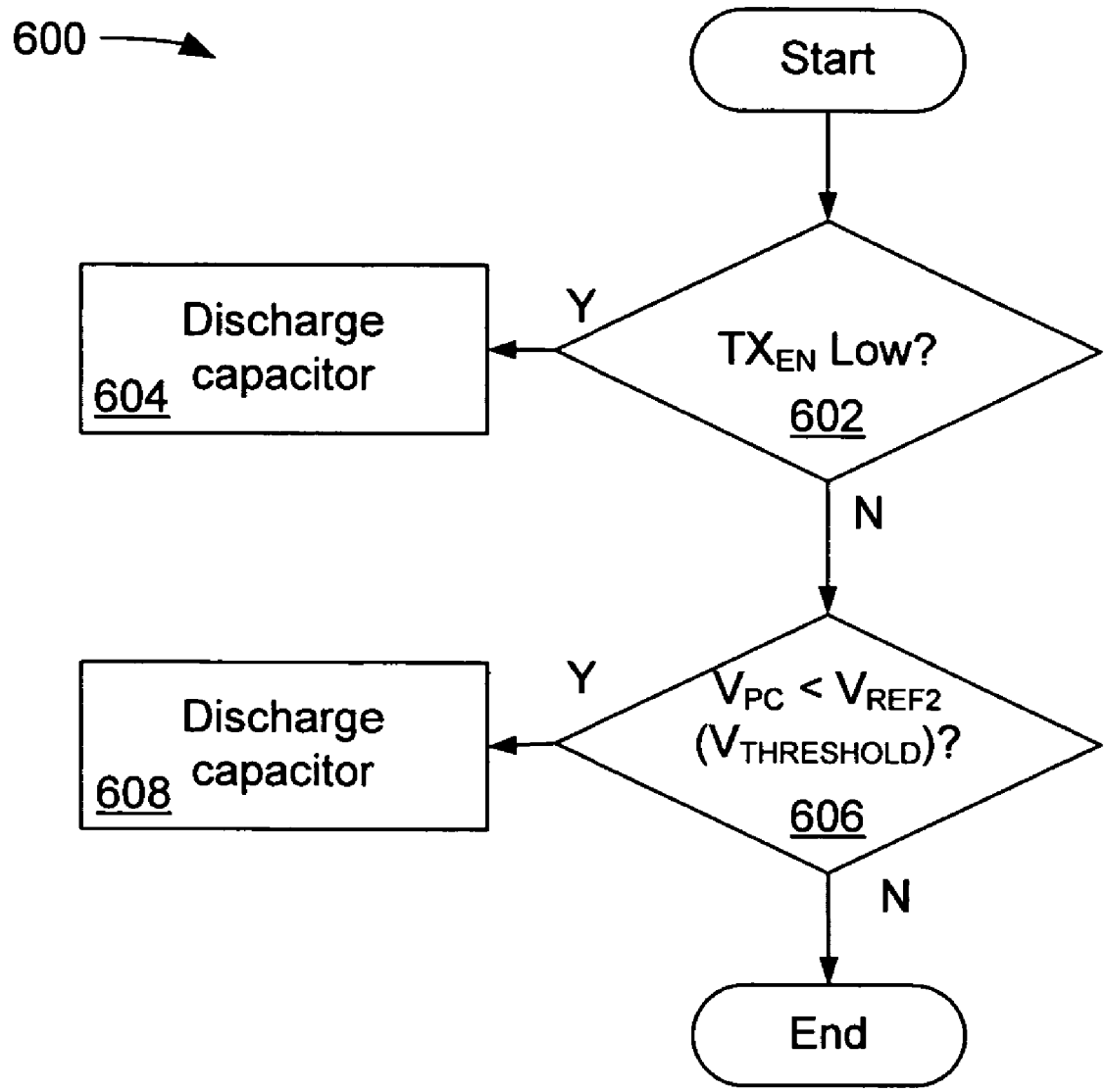
FIG. 6 is a flow chart illustrating the operation of an alternative embodiment of the system and method for saturation detection, correction and recovery.

FIG. 6 is a flow chart illustrating the operation of an alternative embodiment of the system and method for saturation detection, correction and recovery. In block 602 it is determined if the signal $TX_{EN}$ is logic low. If $TX_{EN}$ is logic low, then in block 604, the capacitor 318 is discharged using the amplifier 336 (FIG. 2). If it is determined in block 602 that $TX_{EN}$ is logic high, then in block 606 it is determined if the PA power control voltage, $V_{PC}$ is less than the value of the voltage reference signal, $V_{REF2}$. If the PA power control voltage, $V_{PC}$ is less than the value of the voltage reference signal, $V_{REF2}$, then in block 608, the capacitor 318 is discharged using the amplifier 336 (FIG. 2). If the PA power control voltage, $V_{PC}$ is not less than the value of the voltage reference signal, $V_{REF2}$, then the process ends and the capacitor retains charge.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for saturation detection, correction and recovery in a power amplifier, comprising:
   providing a radio frequency (RF) signal to a power amplifier;
   generating a power control signal ($V_{PC}$) in a closed power control loop;
   providing the power control signal to a comparator;
   comparing the power control signal to a reference signal;
   determining from the comparison whether the power amplifier is operating in a saturation mode; and
   if the power amplifier is operating in a saturation mode reducing the power control signal to the power amplifier.

2. The method of claim 1, wherein reducing the power control signal to the power amplifier further comprises reducing a control signal to a variable gain element in the closed power control loop.

3. The method of claim 2, in which the control signal is reduced by circuitry that reduces the current supplied to the control signal of the variable gain element.

4. The method of claim 3, in which the reference signal is programmable.

5. The method of claim 3, in which the circuitry comprises a current source and a capacitance.

6. The method of claim 5, in which the capacitance maintains charge throughout a transmit burst.

7. The method of claim 1, further comprising reducing the power control signal ($V_{PC}$) to maintain an output power of the power amplifier just below saturation.

8. A system for saturation detection, correction and recovery in a power amplifier, comprising:
   a power amplifier;
   a closed power control loop configured to develop a power control signal ($V_{PC}$); and
   power control circuitry configured to reduce the power control signal if the power amplifier is operating in a saturation mode, wherein the power control circuitry further comprises:
   a comparator configured to receive the power control signal and a reference signal and develop a logic high signal if the power control signal exceeds the reference signal;
   a switch, a current source and a capacitance at the output of the comparator, the switch configured to close when the output of the comparator is logic high, the current source configured to charge the capacitance when the switch is closed; and
   wherein the current supplied from the current source is subtracted from the power control signal.

9. The system of claim 8, in which the reference signal is programmable.

10. The system of claim 8, in which the capacitance maintains charge throughout a transmit burst.

11. The system of claim 8, further comprising an additional comparator configured to discharge the capacitance prior to an end of a transmit burst.

12. The system of claim 8, in which the power control signal ($V_{PC}$) is reduced to maintain an output power of the power amplifier just below saturation.

13. The system of claim 8, in which the current source charges the capacitance until the power amplifier exits saturation.

* * * * *